United States Patent
Ota et al.

(10) Patent No.: US 6,207,469 B1
(45) Date of Patent: Mar. 27, 2001

(54) METHOD FOR MANUFACTURING A SEMICONDUCTOR DEVICE

(75) Inventors: Hiroyuki Ota; Yoshinori Kimura; Mamoru Miyachi, all of Saitama-ken (JP)

(73) Assignee: Pioneer Electronic Corporation, Tokyo (JP)

( * ) Notice: Subject to any disclaimer, the term of this patent is extended or adjusted under 35 U.S.C. 154(b) by 0 days.

(21) Appl. No.: 09/177,805

(22) Filed: Oct. 23, 1998

(30) Foreign Application Priority Data

Oct. 24, 1997 (JP) .................................................. 9-309705

(51) Int. Cl.[7] .................................................. H01L 21/00
(52) U.S. Cl. .................................. 438/22; 438/32; 438/41; 438/47
(58) Field of Search .................................. 438/32, 38, 41, 438/47, 22

(56) References Cited

U.S. PATENT DOCUMENTS

| | | | |
|---|---|---|---|
| 5,247,533 | * | 9/1993 | Okazaki et al. ........................ 372/45 |
| 5,496,766 | * | 3/1996 | Amano et al. ......................... 437/127 |
| 5,661,074 | * | 8/1997 | Tischler ................................. 438/32 |
| 5,747,832 | * | 5/1998 | Nakamura et al. ................... 257/103 |
| 5,932,896 | * | 8/1999 | Sugiura et al. ......................... 257/94 |

OTHER PUBLICATIONS

Wolf, Stanley "Silicon Processing For The VLSI Era vol. I: Process Technology", Lattice Press, pp. 465–471., 1986.*

* cited by examiner

*Primary Examiner*—Andrew Tran
*Assistant Examiner*—Michael S. Lebentritt
(74) *Attorney, Agent, or Firm*—Arent Fox Kintner Plotkin & Kahn, PLLC (57) ABSTRACT

A GaN type semiconductor layer in which a group 2 impurity element is added is formed. The GaN type semiconductor layer is heated at a predetermined temperature, while irradiating the semiconductor layer with an electromagnetic wave having an energy larger than the band gap energy of the GaN type semiconductor layer.

9 Claims, 11 Drawing Sheets

METHOD FOR MANUFACTURING A SEMICONDUCTOR DEVICE

BACKGROUND OF THE INVENTION

The present invention relates to a method for manufacturing a semiconductor device having a gallium nitride semiconductor layer.

In the field of semiconductor device such as a light-emitting diode and a semiconductor laser diode, attention has been called to a wide-gap semiconductor device capable of emitting blue light. Such a semiconductor device has a semiconductor layer in which a group 2 element, such as magnesium (Mg) and zinc (Zn), is added to a single crystal of nitride semiconductor which is expressed, for example as $(Al_xGa_{1-x})_{1-y}In_yN$, ($0 \leq x \leq 1.0$, $0 \leq y \leq 1.0$).

The epitaxial growth of the above-described nitride semiconductor is usually carried out by the metal organic chemical vapor deposition (MOCVD) method. However, the semiconductor layer formed by the MOCVD method and applied with the group 2 element such as magnesium and zinc has extremely high resistance in the as-grown state, so that the electric current cannot flow through the layer in order to emit the blue light from the semiconductor device.

There has recently been reported a method for converting the high resistant nitride semiconductor into a p-type semiconductor by applying a special treatment thereto. For example, a low accelerated electron beam is radiated onto the nitride semiconductor to form a low resistance p-type semiconductor (H. Amano et al.,: Jpn. J. Appl. Phys. Vol. 28, 1989, pp. L2112–2114), or the nitride semiconductor is subjected to a heat treatment of 800° C. in a nitrogen atmosphere under the atmospheric pressure or higher For about 20 minutes to also form a low resistance p-type semiconductor (S. Nakamura et al.,: Jpn. J. Appl. Phys. Vol. 31, 1992, pp. L139–142).

The low accelerated electron beam method provides a p-type semiconductor having an extremely high hole density at room temperature in the order of $10^{18}$ cm$^{-3}$. However, the depth of the semiconductor which can be treated is limited to the depth wherein the electron beam can be permeated, and therefore about 0.3 m in the case of electron beam applied at accelerated voltage of 6 to 30 KV (S. Nakamura et al.,: Jpn. J. Appl. Phys. Vol. 31, 1992, pp. L139–142). In addition, since the treatment must be executed by scanning the electron beam in vacuum, not only the apparatus for the treatment must be enlarged, but also requires a longer time to treat one wafer, thereby causing a drawback for the mass production.

On the other hand, the heat treatment imposes less restriction than the low accelerated electron beam radiation method with regard to the treating depth, and more over, is appropriate for mass production, since a large number of wafers can be put in a heating furnace at one charge. However, as can be understood from the experiments conducted by S. Nakamura et al., the discoverers of the phenomenon, the hole density at room temperature remains at $3 \times 10^{17}$ cm$^{-3}$, which is clearly smaller than that achieved by the low accelerated electron beam treatment. The value $3 \times 10^{17}$ cm$^{-3}$ is sufficient for forming the pn diode which is the basic component of the light-emitting diode and semiconductor laser, so that the heat treatment has heretofore been employed in practice for manufacturing the light-emitting diode.

One of the problems which is generated by the heat treatment when manufacturing the semiconductor devices and more particularly, semiconductor laser devices is the contact resistance of electrodes.

In general, at the interface between a metal and a semiconductor, there is formed an electrical barrier which restricts the transmission of the electrons and the holes. When the electric barrier is high, the electric current between the metal and the semiconductor is rectified so as to be imparted with a threshold voltage when electric current is applied. Such a junction, which is called a Schottky junction, is extremely disadvantageous except when intentionally used, so that there is usually taken some measures to render the contact between the metal and the semiconductor an ohmic contact, and hence, linear.

There are several ways for providing the ohmic contact, the basic necessary condition being sufficiently increasing the density of the carriers adjacent the interface, that is, electrons in the n-type semiconductor and holes in p-type semiconductor. When the density of the carriers directly under the electrode is sufficiently high, and the Fermi level is within the conduction band or the valence band, the semiconductor becomes so-called metallic, thereby providing the ohmic contact irrespective of the kind of metal used as the electrode.

However, in the above-described heat treatment for imparting a p-type characteristic, the hole density is not sufficient so that the problem of the large contact resistance at the electrode still remains.

SUMMARY OF THE INVENTION

An object of the present invention is to provide a method for manufacturing a semiconductor device wherein the contact resistance between the device and the electrode is small, and wherein the mass production is easily realized.

According to the present invention, there is provided a method for manufacturing a semiconductor device, the steps comprising, forming a GaN type semiconductor layer in which a group 2 impurity element is added, heating the GaN type semiconductor layer at a predetermined temperature, and irradiating the semiconductor layer with an electromagnetic wave having an energy larger than the energy band gap energy of the GaN type semiconductor layer, and forming an electrode on the semiconductor layer.

The electromagnetic wave is applied to a surface of the GaN type semiconductor layer.

The electromagnetic wave is applied for a predetermined time when the GaN type semiconductor layer is at the predetermined temperature.

The GaN type semiconductor layer is a group 3 nitride expressed by a following formula $(Al_xGa_{1-x})_{1-y}In_yN (0 \leq x \leq 1.0,\ 0 \leq y \leq 1.0)$ The wavelength of the electromagnetic wave corresponds to the composition of an uppermost layer of the GaN type semiconductor layer.

The step for forming the GaN type semiconductor layer is performed by the metal organic chemical vapor deposition method.

The electromagnetic wave is continuously applied to the GaN type semiconductor layer until the temperature of the semiconductor layer becomes lower than 300° C.

These and other objects and features of the present invention will become more apparent from the following detailed description with reference to the accompanying drawings.

Figure 1:
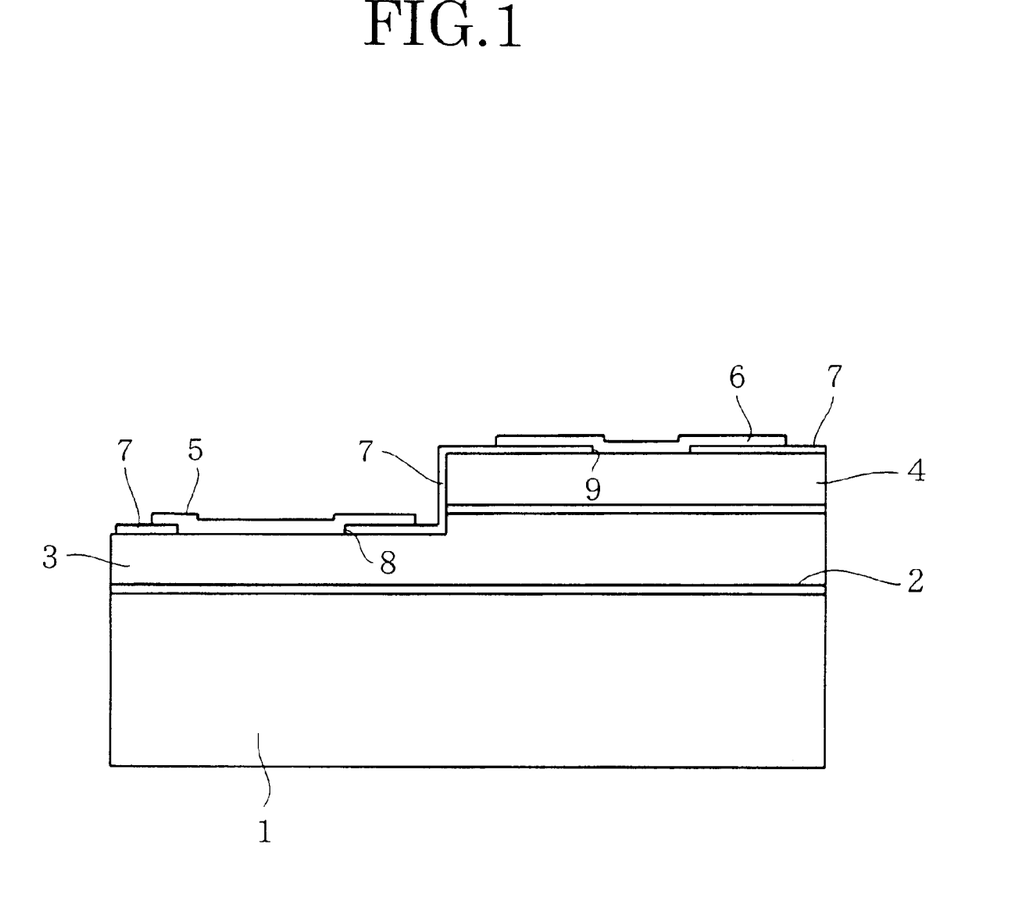
FIG. 1 is a diagram showing a structure of a semiconductor device.

DETAILED DESCRIPTION OF THE PREFERRED EMBODIMENT (I) Structure of a Semiconductor Device FIG. 1 shows a semiconductor device manufactured in accordance with the present invention comprising a sapphire substrate on which a p-n diode of gallium nitride (GaN) having a homo-junction structure is Lormed.

Referring to FIG. 1, the semiconductor device has a sapphire substrate 1 on which an aluminum nitride (AlN) buffer layer 2 is formed. An n-type GaN layer 3 doped with silicon (Si), or $(Al_xGa_{1-x})_{1-y}In_yN$, ($0 \leq x \leq 1.0$, $0 \leq y \leq 1.0$) doped with Si is formed on the buffer layer 2. A p-type GaN layer 4 doped with magnesium (Mg), or $(Al_xGa_{1-x})_{1-y}In_yN$, ($0 \leq x \leq 1.0$, $0 \leq y \leq 1.0$) doped with Mg is formed on a part of the n-type GaN layer 3. An impurity element which is doped on the p-type GaN layer is not confined to Mg and elements in group 2A such as beryllium (Be) and calcium (Ca) and in group 2B such as zinc (Zn) may be employed.

A silicon oxide ($SiO_2$) protection layer 7 is formed on the surfaces of the n-type GaN layer 3 and the p-type GaN layer 4. The protection layer 7 has a window 8 in the portion above the n-type GaN layer 3 and a window 9 in the portion above the p-type GaN layer 4. An electrode 5 is formed on the protection layer 7 at the portion above the n-type GaN layer 3, and an electrode 6 is formed at the portion above the p-type GaN layer 4. The electrode 5 contacts the n-type GaN layer 3 only through the window 8 formed in the protection layer 7. Similarly, the electrode 6 contacts the p-type GaN layer 4 only through the window 9.

(II) Method of Manufacturing the Semiconductor Device

The method for manufacturing the semiconductor device of FIG. 1 is described.

(Wafer Producing Process)

The sapphire substrate 1 is charged in a furnace for forming a film in accordance with the MOCVD growth. The sapphire substrate 1 is retained in the furnace wherein hydrogen flows and the temperature is 1050° C., for ten minutes so that the surface of the substrate 1 is thermally cleansed. After the temperature of the sapphire substrate 1 is lowered to 600° C., ammonia ($NH_3$) as a precursor of nitrogen and trimethyl aluminum (TMA) as a feed material of aluminum are introduced into the furnace so that the AlN buffer layer 2 of 20 nm is formed in layer on the substrate 1.

Thereafter, the supply of the TMA is stopped and only $NH_3$ is allowed to flow. The sapphire substrate 1 on which the buffer layer 2 is layered is again heated to 1050° C. This time, trimethyl gallium (TMG) is introduced into the furnace to form the n-type GaN layer 3. Methyl silane (Me—$SiH_3$) is added at that time as an n-type impurity.

When the n-type GaN layer 3 is grown to have a thickness about 2 m, the supply of Me—$SiH_3$ is stopped, and ethyl cyclopentadienyl magnesium (Et—$Cp_2Mg$) as a feed material of magnesium which is the p-type impurity is introduced instead.

When the GaN layer doped with magnesium is grown to have a thickness about 1 m, the supply of feed material except $NH_3$ is stopped, and at the same time cooling is started. When the temperature is decreased to be near the room temperature, the wafer on which are formed the n-type GaN layer 3 and the GaN layer 4 doped with Mg is taken out from the MOCVD growth furnace.

(P-Type Semiconductor Layer Forming Process)

Figure 2:
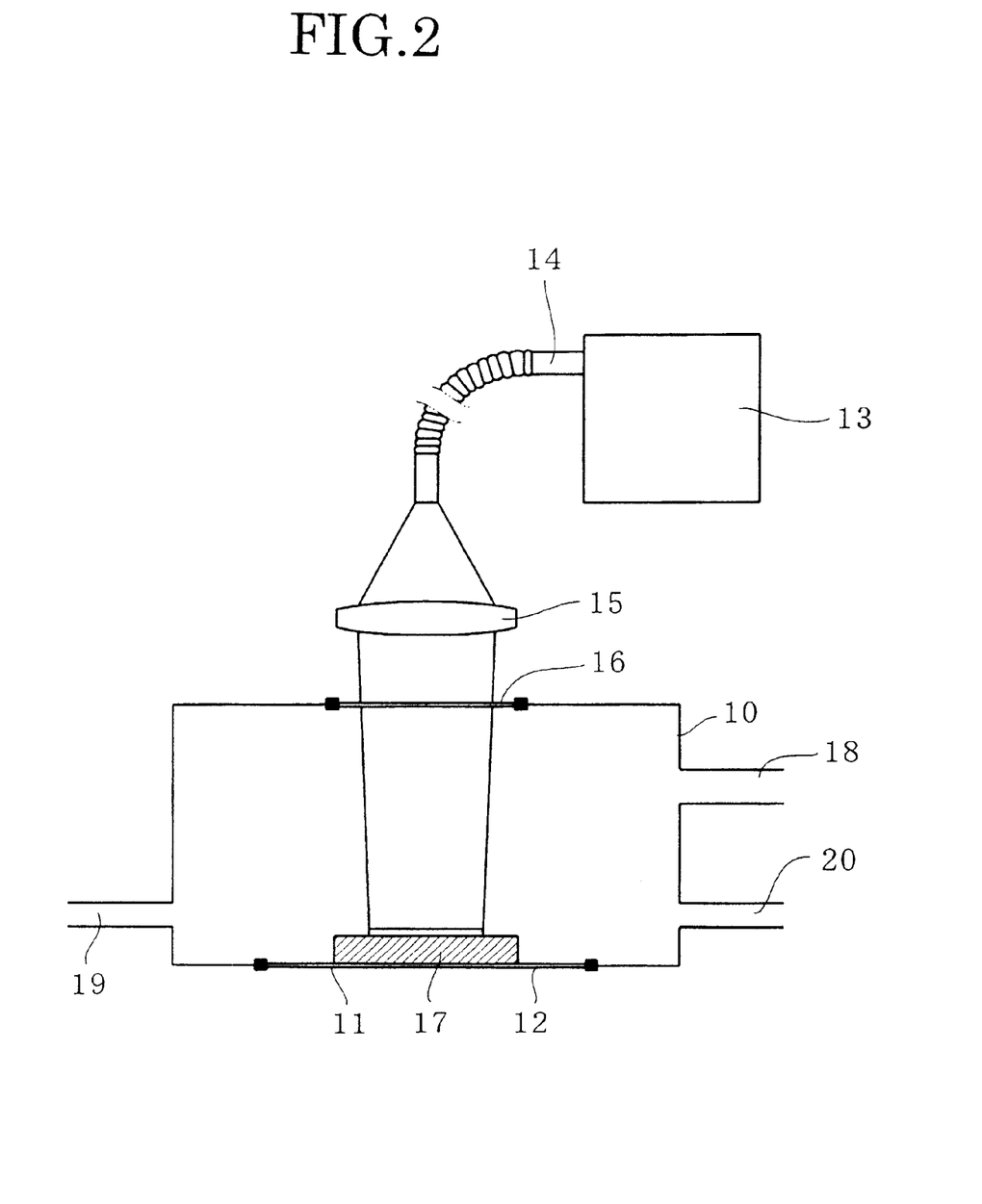
FIG. 2 is an illustration of a furnace for heat treatment employed in the method of the present invention.

Referring to FIG. 2, a heating furnace used in the method of the present invention comprises a stainless steel body 10 having a gas inlet 19, an exhaust opening 18, and a gas exhaust opening 20. A susceptor 11 made of graphite is provided in the body 10 so as to mount a wafer 17 formed by the wafer producing process described above. The susceptor 11 is heated from below by such a means as a infrared lamp (not shown) through a quartz window 12 formed on the bottom of the body 10.

A light source 13 is provided above the body 10. The light from the light source 13 is introduced to a condenser lens 15 of quartz glass through an optical fiber 14 and applied to the susceptor 11 through a light introducing window 16 formed on the top of the body 10. A mercury xenon lamp is employed as the light source 13 and the light beams removed of light in the visible spectrum range and infrared range are radiated.

The radiated light, which is an electromagnetic wave, has a shorter wavelength than a wavelength corresponding to a band gap, namely a width of the energy band gap of the semiconductor layer 4 formed on the uppermost surface of the wafer subjected to heat treatment. For example, if the semiconductor layer on the uppermost layer is made of GaN, the band gap of which is 3.4 eV, an ultraviolet light having a wavelength shorter than 365 nm is used.

The electromagnetic wave may have a wavelength, whose energy becomes larger than the band gap energy of an uppermost layer.

If the semiconductor layer on the uppermost surface is made of a group 3 nitride expressed by a formula $(Al_xGa_{1-x})_{1-y}In_yN$, where $0 \leq x \leq 1.0$, $0 \leq y \leq 1.0$, the wavelength of the electromagnetic wave used for radiation varies in a range between about 650 nm, which corresponds to the band gap of indium nitride (InN), and about 200 nm, which corresponds to the band gap of aluminum nitride (AlN), depending on the values of x and y. Therefore any light source 13 besides the mercury xenon lamp may be selected in accordance with the electromagnetic wave to be radiated. After the wafer 17 is mounted on the susceptor 11, air in the body 10 is pumped out through the exhaust opening 18 using a vacuum pump (not shown). Thereafter, high-purity nitrogen gas is introduced to displace the air with the gas. As soon as the pressure in the body 10 reaches the atmospheric pressure, the gas exhaust opening 20 is opened, thereby forming a flow of nitrogen.

Then the susceptor 11 is heated by the infrared lamp to the temperature of 800° C. When the temperature of the wafer 17 reaches 800° C., the ultraviolet light emitted from the light source 13 is applied to the GaN semiconductor layer doped with Mg. The temperature of the wafer 17 when irradiated by the electromagnetic wave is preferably higher than 300° C. and lower than 1000° C. The reason for thus setting the temperature is that, as will be described later in detail, the dissociation of Mg—H complex occurs at about 300° C. so that there is no effect when the temperature is under 300° C., and degradation of the semiconductor layer and/or the device structure occurs in the temperature range higher than 1000° C.

The phenomenon which occurs within the GaN layer doped with Mg in the p-type semiconductor forming process is later described.

(Semiconductor Device Forming Process)

An etching mask is formed by an ordinary photolithography on the wafer 17 which has undergone the above described process. Unnecessary portions of the p-type GaN layer 4 are removed by reactive ion etching (RIE), thereby partially exposing the n-type GaN layer 3.

After the etching mask is removed, a layer of photoresist is applied. The photoresist is then removed by photolithography except for the portions on which the electrodes 5 and 6 are to be mounted. The $SiO_2$ protection layer 7 is formed on the photoresist by such a method as sputtering. Thereafter, unnecessary portions of the protection layer 7 as well as the photoresist are removed by the liftoff method, thereby forming the windows 8, 9 in the protection layer 7.

On the surface where the n-type GaN layer 3 is exposed, 50 nm of titanium (Ti), and then 200 nm of aluminum (Al) are deposited by evaporation, thereby forming the electrode 5. On the surface where the p-type GaN layer 4 is exposed, 50 nm of nickel (Ni), and then 200 nm of gold (Au) are deposited by evaporation, thereby forming the electrode 6. The wafer is then cut to form the semiconductor device.

Hence the semiconductor device shown in FIG. 1 is obtained through the wafer producing process, p-type semiconductor layer forming process, and the semiconductor device forming process.

(III) Phenomenon Which in the Semiconductor Layer During the Heat Treatment

When the GaN semiconductor layer added with an element of the group 2 such as magnesium is rendered to grow by the MOCVD method, hydrogen is incorporated into the semiconductor layer so that the magnesium which is to become the acceptor impurities is in the passivated state. The quantity of the hydrogen is substantially equal to the quantity of the added magnesium so that it is assumed that the magnesium and hydrogen are incorporated in the semiconductor layer in the compounded form of Mg—H.

In the conventional method wherein the semiconductor device is heated in a nitrogen atmosphere of 800° C. for about 20 minutes so that hydrogen in the semiconductor layer is desorbed. As a result, there is generated in the semiconductor layer effective acceptors in a quantity which corresponds to the difference between the density of the Mg atoms and the density of hydrogen atoms which remain after the heat treatment process. Hence the semiconductor layer doped with Mg is converted into the p-type semiconductor layer.

FIGS. 5 to 8 show the results evaluated by secondary ion mass spectroscopy (SIMS) in GaN semiconductor layer doped with Mg. The sample used was an n-type GaN semiconductor layer doped with Si on which a film of GaN semiconductor layer doped with Mg was formed.

Figure 5:
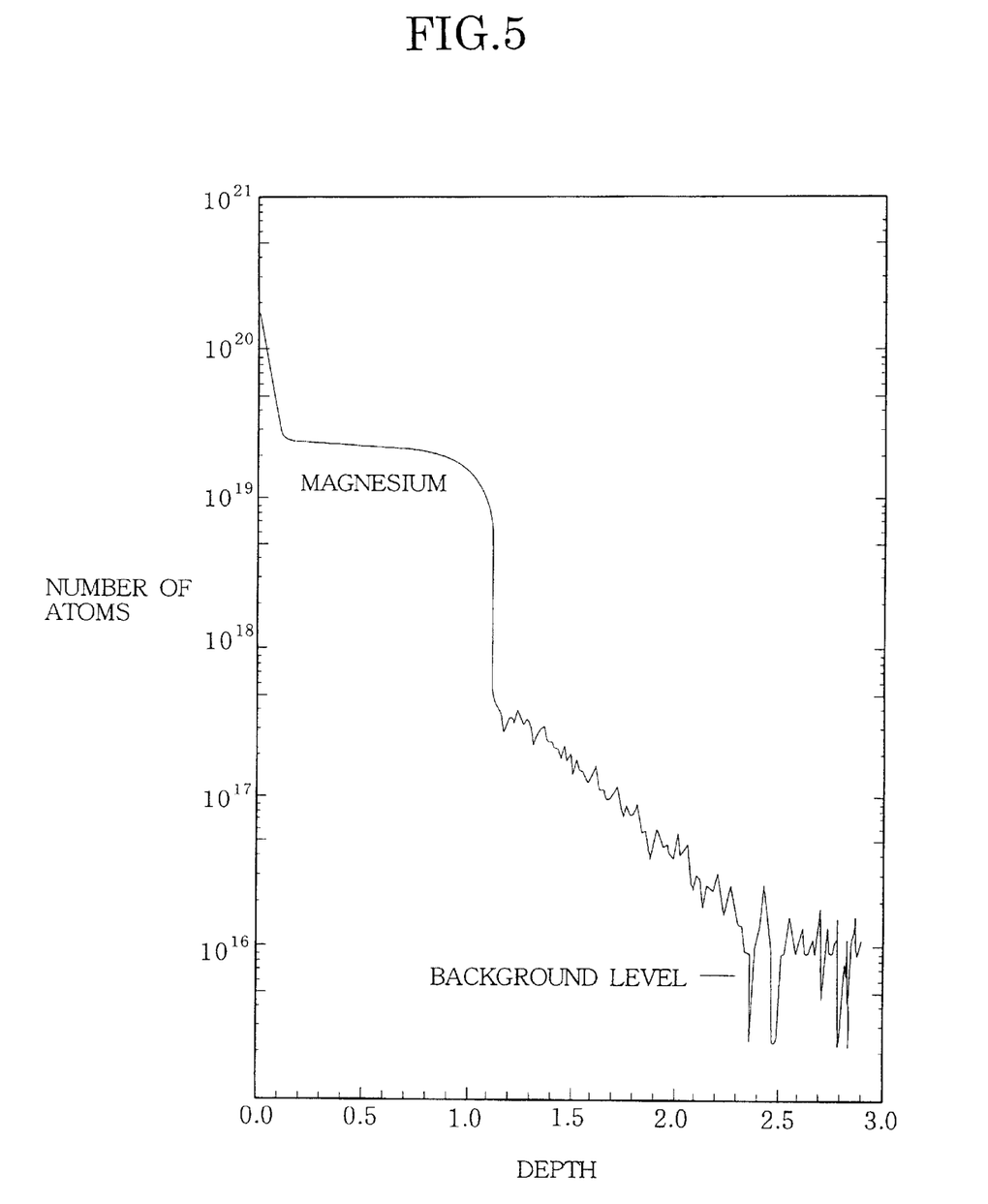
FIG. 5 is a graph showing the number of magnesium atoms depending on depth in a semiconductor layer before a heat treatment.
Figure 6:
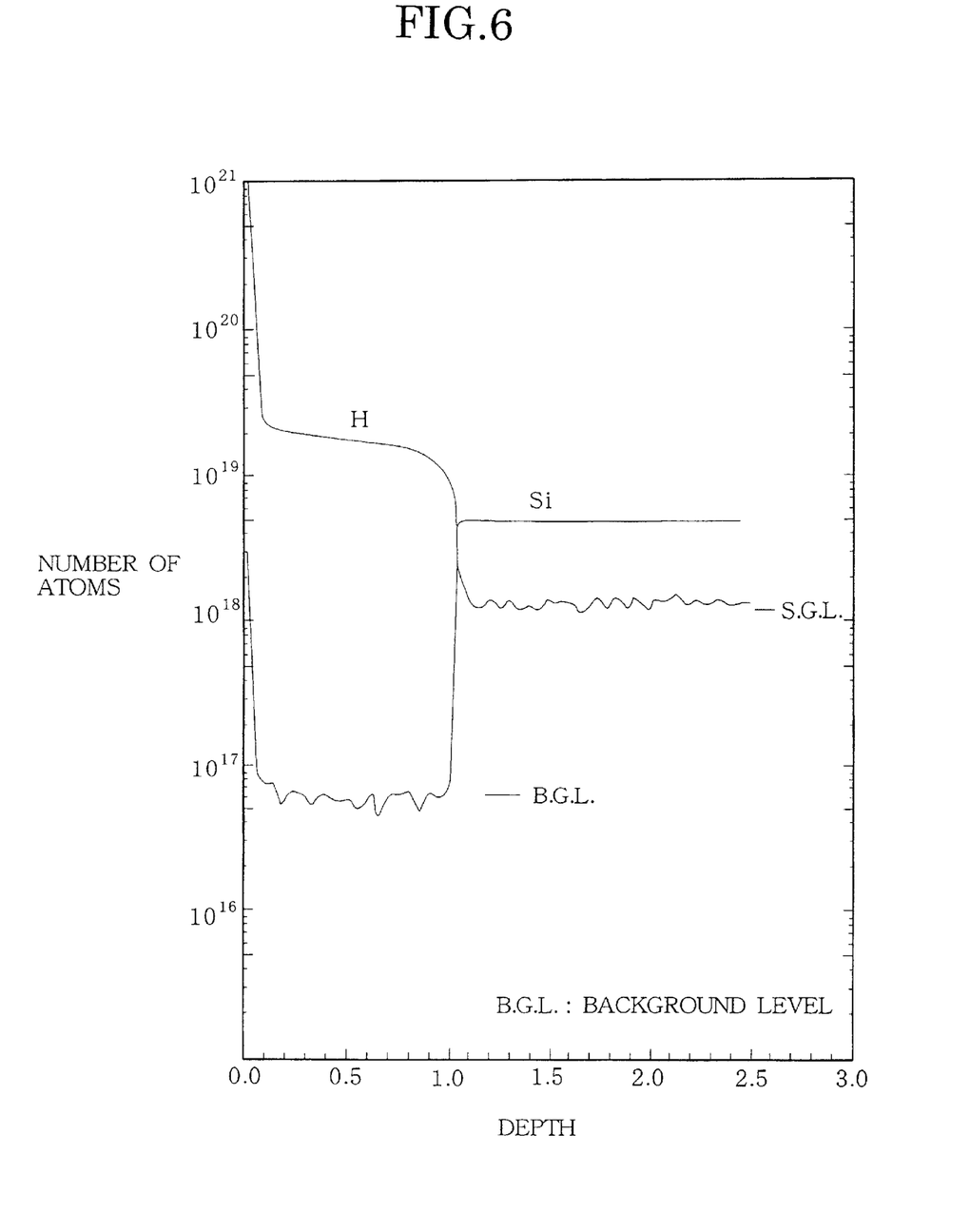
FIG. 6 is a graph showing the numbers of hydrogen and silicon atoms dependent on depth in the semiconductor layer before the heat treatment.
Figure 7:
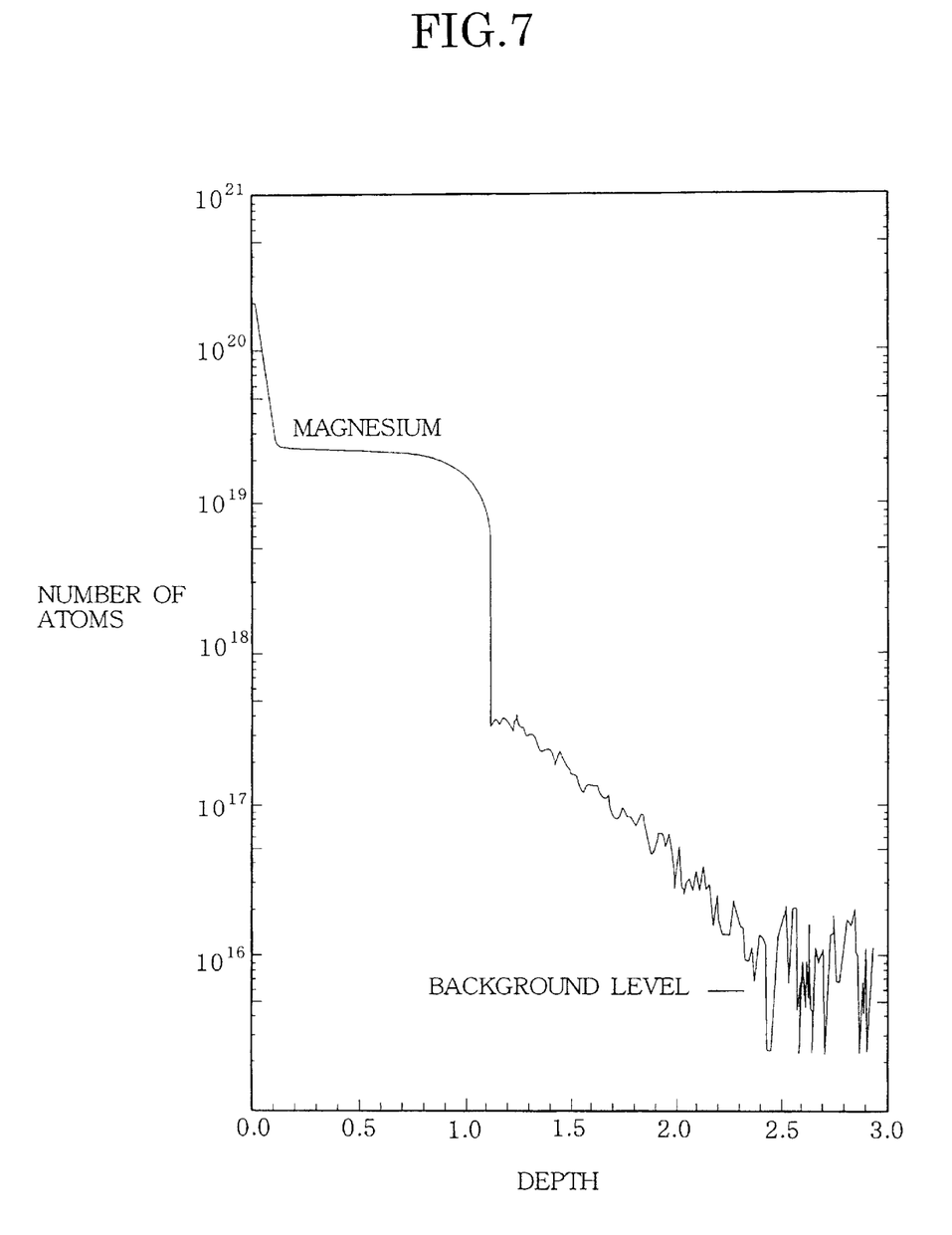
FIG. 7 is a graph showing the number of magnesium atoms depending on depth in a semiconductor layer after a conventional heat treatment.
Figure 8:
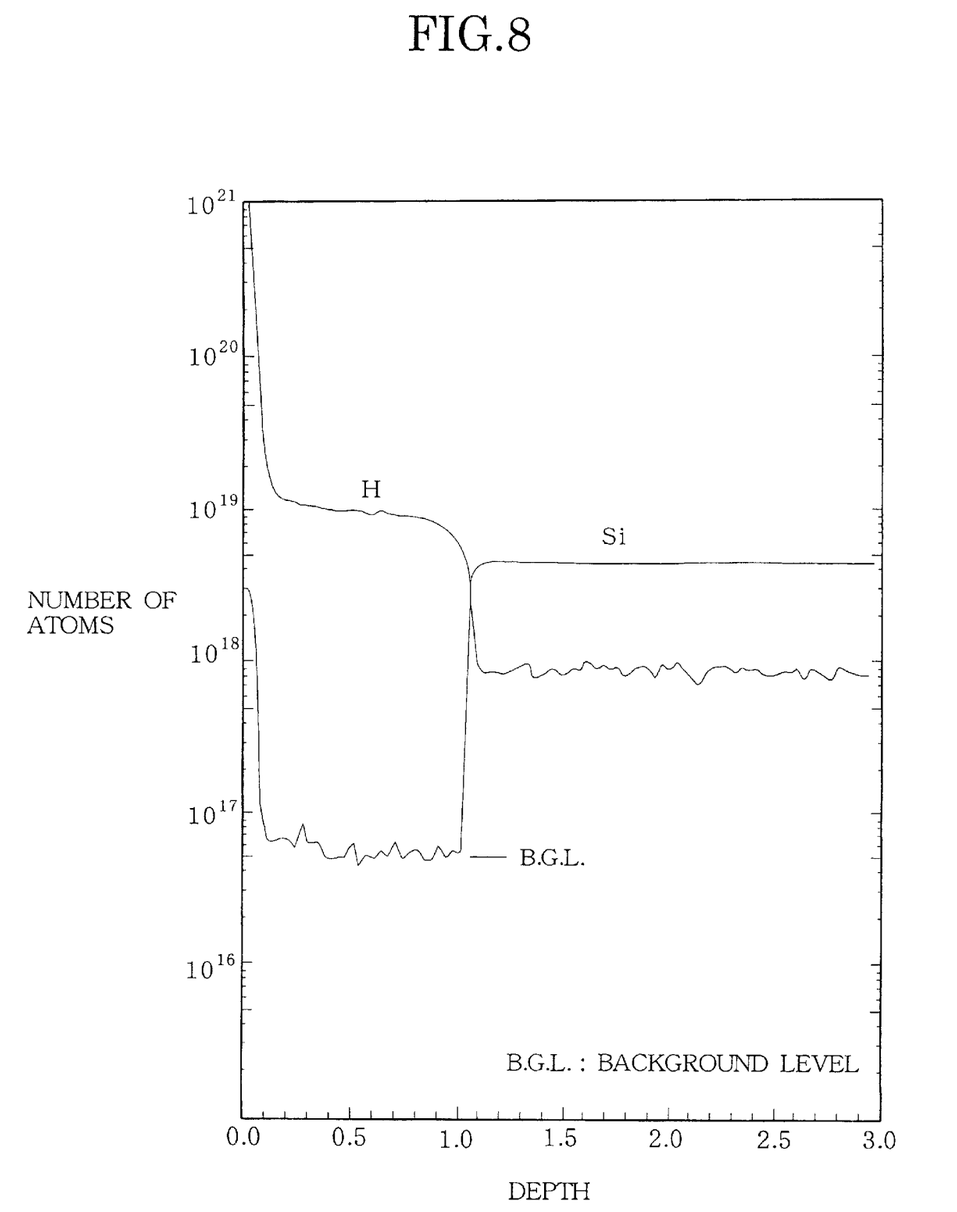
FIG. 8 is a graph showing the numbers of hydrogen and silicon atoms dependent on depth in the semiconductor layer after the conventional heat treatment.

FIGS. 5 and 6 show the results of the samples as-grown, and FIGS. 7 and 8 show the results after a heat treatment of 800° C. for 20 minutes.

In each of FIGS. 5 and 7, the ordinate indicates the number of atoms of Mg existing in 1 $cm^3$, and the abscissa indicates the depth ($\mu$m) from the surface. In each of FIGS. 6 and 8, the ordinate indicates the number of atoms of hydrogen and silicon existing in 1 $cm^3$, and the abscissa indicates the depth ($\mu$m) from the surface.

As apparent from FIGS. 5 and 6, in the case of the as-grown samples, the number of hydrogen atoms and the number of Mg atoms in the semiconductor layer doped with Mg in the region of 1.0 $\mu$m from the surface are $2\times10^{19}$ $cm^{-3}$ so that the density of hydrogen and the density of magnesium are substantially equal to each other within calibration error. FIGS. 7 and 8 show that, in the case of heated samples, while the number of the magnesium atoms is the same as in FIG. 5, the number of hydrogen atoms is about $2\times10^{19}$ $cm^{-3}$, which is about half as much as before the heat treatment. Thus the effect of the heat treatment estimated above is proven.

The important point regarding the heated sample is that the density of hydrogen in the p-type semiconductor layer is not decreased to that in the n-type semiconductor layer, which is $10^{18}$ $cm^{-3}$ at measurable limit value. The hole density of the heated sample at room temperature, which is $2\times10^{17}$ $cm^{-3}$, taking into account the fact that the thermal activation rate of the Mg acceptor in the p-type semiconductor layer is in the order of $10^{-2}$, is substantially equal to the hole density which is calculated assuming that the difference in densities of Mg and hydrogen substantially equals to the effective acceptor density. Accordingly, in the case of heat treatment at 800° C. for 20 minutes, the resultant hole density is determined dependening not directly on the density of magnesium added to the semiconductor layer, but on the quantity of hydrogen desorbed from the semiconductor layer.

Figure 9:
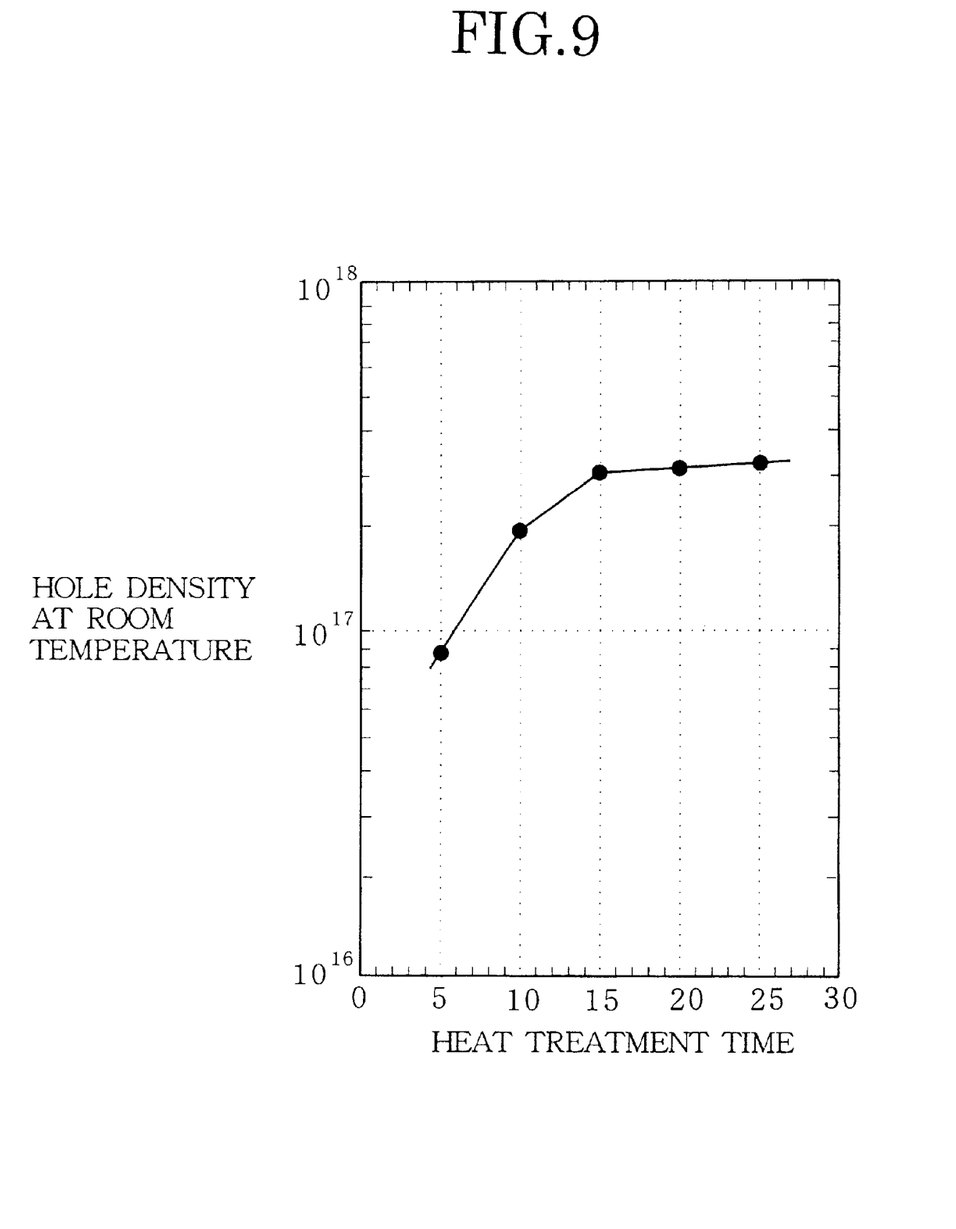
FIG. 9 is a graph showing the relationship between heating time and room temperature carrier density.

FIG. 9 shows the change in density of carriers at room temperature with heating period wherein the ordinate indicates the hole density at room temperature and the abscissa indicates the period of heat treatment. It can be seen from the graph that after heat treatment of 15 minutes, the hole density becomes constant and hence 20 minutes of heating is sufficient.

Therefore, although duration of the heat treatment at 800° C. is extended, an increased hole density which corresponds to the quantity of the added Mg could not be obtained. It is hence assumed that the hydrogen in the semiconductor layer doped with Mg is not sufficiently desorbed.

It is apparent that the process of desorbing hydrogen from the semiconductor layer doped with Mg in the conventional heat treatment includes diffusion of hydrogen. The desorption of hydrogen, if taken alone, must be enhanced with the increase of the temperature. However, when the heat treatment is carried out at a temperature higher than 1000° C., desorption of nitrogen from the GaN layer is enhanced, thereby deteriorating the semiconductor layer and the mutilayer structure of the semiconductor device due to thermal diffusion.

In order to prevent the deterioration, it is possible, in principle, to employ a process of covering the surface of the semiconductor layer with a film capable of transmitting hydrogen but not nitrogen, and later removing the film. However, it is inadvisable to repeat the covering and removing of the film in view of mass production, and moreover, the process is liable to leave contamination on the surface. In particular, when there is a contamination on the surface on which metal as the electrode is deposited in the later process, the contact resistance between the surface and the electrode is liable to become high.

The inventors of the present invention have thus found out that it is impossible to completely take out the hydrogen included in the p-type semiconductor layer by the conventional heating process without degrading the quality of the semiconductor layer.

It is considered that the desorption of hydrogen from the p-type GaN semiconductor layer doped with Mg stops at an incomplete stage as shown in FIG. 8, due to a powerful rate-determining step existing somewhere in the hydrogen desorption process.

The value of barrier energy of a magnesium-hydrogen (Mg—H) complex, which is called a complex in general, regarding thermal dissociation, is considered to be about 1.5 eV in principle. (Refer to J. Neugebauer et al.,: Mat. Res. Soc. Symp. Proc. Vol. 423, pp 619–623.) In regard to such a high barrier height, the effect of the hydrogen desorption should become apparent when heated at about 300° C.

To the contrary, the semiconductor is imparted with significant po-type effect only in a temperature range higher than 600° C. in practice (S. Nakamura et al.,: Jpn. J. Appl. Phys. Vol. 31, 1992, pp. 1258–1266). The thermal dissociation of Mg—H complex is expressed as, $$\text{Mg—H} \rightarrow \text{Mg}^- + \text{H}^+ \tag{1}$$

The calculated barrier energy of $H^+$ regarding the diffusion within the GaN semiconductor layer is about 0.7 eV. (Refer to J. Neugebauer et al. Phys. Rev. lett. 75, 1995, P4452.) These calculations imply the possibility of another obstacle in enhancing the desorption of hydrogen from the semiconductor layer. (Refer to J. Neugebauer et al.,: Mat. Res. Soc. Symp. Proc. Vol. 423, p 623.)

In the GaN semiconductor layer doped with Mg heated to about 800° C., there occurs the dissociation of the Mg—H complex as shown by the reaction (1). Since the barrier energy is small in the Mg—H dissociation reaction, it is considered that all of the Mg—H complexes in the GaN semiconductor layer doped with Mg are dissociated in accordance with the reaction (1).

In the reaction, although $H^+$ is relatively easily diffused in the GaN semiconductor layer, $H^+$ cannot be dissociated in the original state, since $H^+$ is a proton, and hence cannot enter the atmosphere within the heating furnace wherein the nitrogen gas is filled. Namely, in order that the hydrogen is desorbed from the surface of the GaN semiconductor layer doped with Mg, the hydrogen must have a form of the hydrogen gas molecule, hereinafter referred to as $H_2$.

Moreover, for desorbing $H_2$, there occurs the following reactions.

$$H^+ + e^- \rightarrow H^0 \tag{2},$$

and $$H^0 + H^0 \rightarrow H_2 \tag{3}$$

In the reaction (2), $H^+$ captures a negative charge so as to be neutralized. In the reaction (3), a pair of neutralized $H^0$ are associated to form $H_2$. It is not correct in practice to express the neutralizing reaction (2) as happening in only one direction. When the formation energy of hydrogen ($H^+$, $H^0$, $H^-$) in the semiconductor layer is calculated, the energy for forming $H^0$ is larger than the charged state of $H^+$ or $H^-$ under any Fermi level condition. (Refer to J. Neugebauer et al.,: Mat. Res. Soc. Symp. Proc. Vol. 395, p 645 regarding this point.) Namely, $H^0$ which is in a neutral state is unstable in the semiconductor layer.

This means that the reaction in a direction reverse of that shown in the reaction (2) is liable to occur. Hence the reaction must be expressed as $$H^+ + e^- \Longleftrightarrow H^0 \tag{4}$$

On the other hand, in the case of the reaction (3), due to the thermal stability of hydrogen, most of the reactions are in the direction from left to right.

It can be assumed from these observations that the step which determines the rate of the desorption of hydrogen is the neutralizing reaction shown by the reaction (2).

Figure 10:
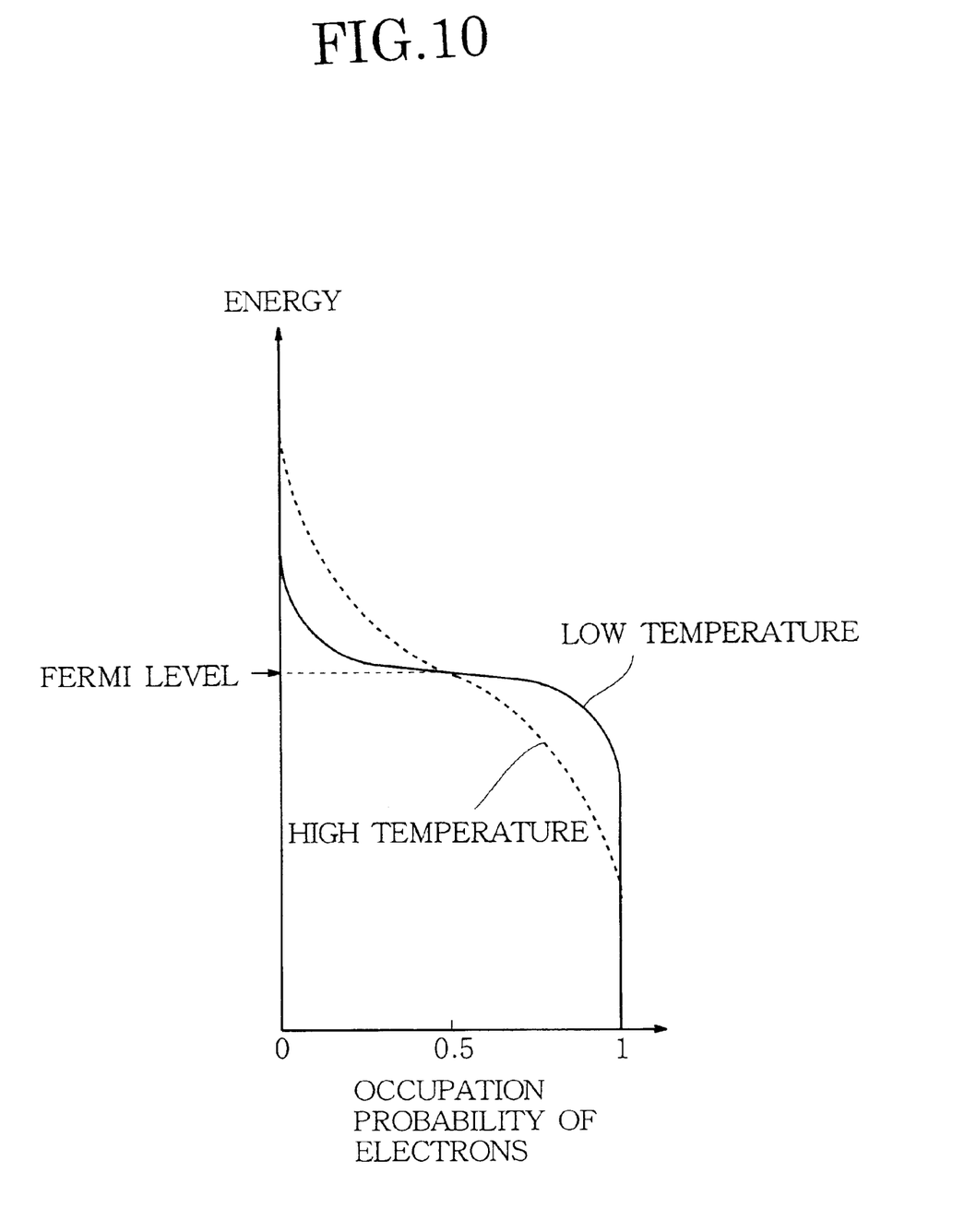
FIG. 10 is a graph showing the Fermi level in a semiconductor layer.

In the reaction (2), $e^-$ (electron) on the left side is clearly the electron in the conduction band. The GaN semiconductor layer doped with Mg at room temperature before the heat treatment is substantially an insulator, so that the density of the electrons in the conduction band is nil. In addition, the Fermi level is substantially in the middle of the band gap. Supposing that the temperature is raised in a condition where the density of $Mg^-$ stays the same as that of $H^+$, that is the hydrogen is not desorbed at all, the Fermi distribution changes more gradually as shown in FIG. 10 while the position of the Fermi level hardly moves. In FIG. 10, the ordinate indicates the energy of electrons and the abscissa indicates occupation probability of electrons.

The density of the electrons in the conduction band is approximated by the product of the effective density of states of the conduction band and the Fermi distribution, so that the density of the electrons therein is increased as the temperature rises. These electrons enhance the neutralizing reaction of $H^+$, and as a result, hydrogen is desorbed from the semiconductor layer.

However, the density of the electrons thus generated is extremely low at about $10^{11}$ cm$^{-3}$ at 800° C. in the case of GaN having a large band gap of about 3.4 eV at room temperature.

GaN semiconductor layer doped with Mg is imparted with the p-type characteristic as the hydrogen is desorbed from the semiconductor layer. This means that the Fermi level of the GaN semiconductor moves toward the valence band so that the density of the electrons in the conduction band is quickly decreased.

Figure 11:
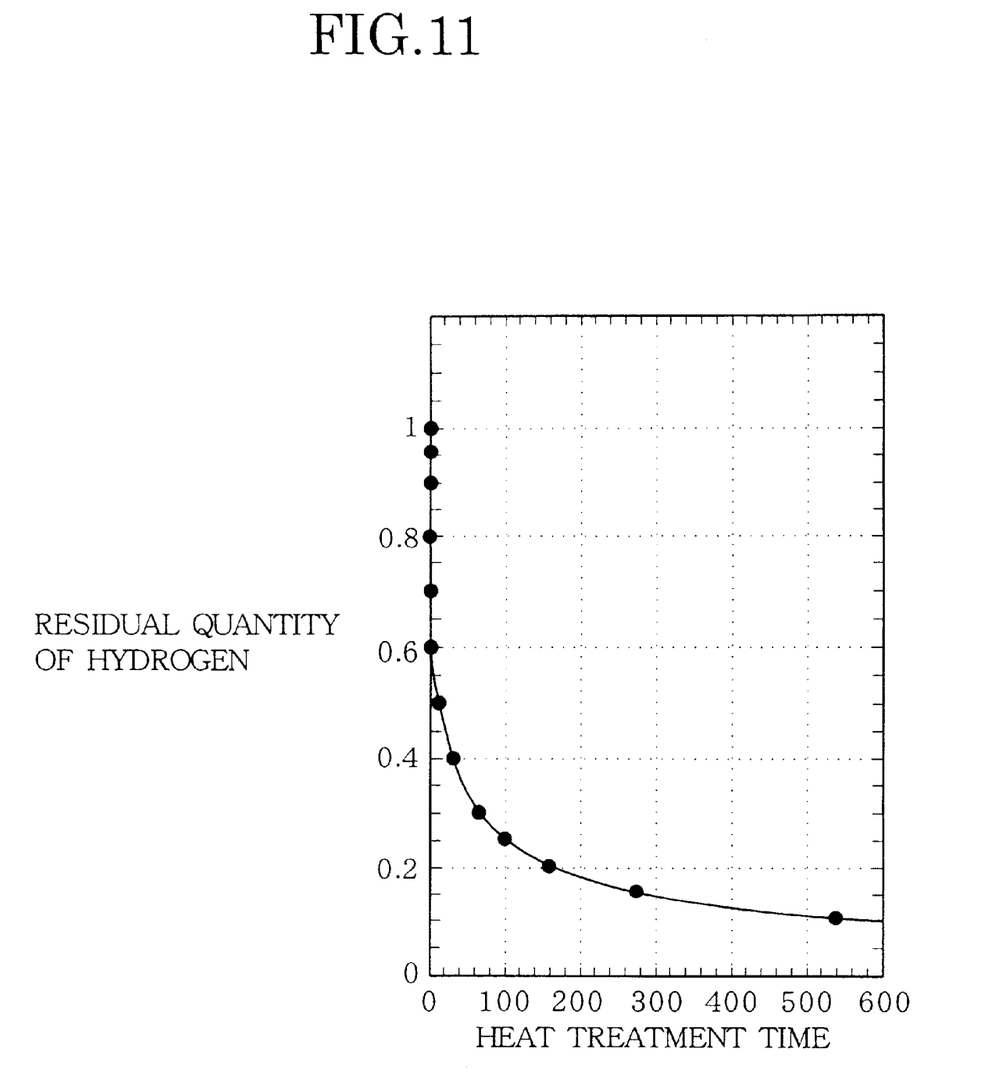
FIG. 11 is a graph showing the relationship between heating time and quantity of residual hydrogen.

FIG. 11, in which the ordinate indicates the relative residual quantity of hydrogen and the abscissa the heat treatment time, shows the density of hydrogen remaining in the semiconductor layer calculated based on the above described reactions (1) to (3) in accordance with the length of heating time. The quantity of the hydrogen is calculated assuming that at the temperature of 800° C., the magnesium acceptor is completely ionized, the diffusion of $H^+$ is quick enough not to cause generation of density distribution of $H^+$ in the semiconductor layer, and that the product of electron density and the hole density (np product) is constant under a constant temperature.

As shown in FIG. 11, in the initial stage of the heat treatment, the hydrogen is quickly desorbed. The desorption rate is quickly decreased as the p-type characteristic appears. Hence, under the definite p-type condition wherein several tens of percents of hydrogen are desorbed so that the density thereof is about $10^{17}$ cm$^{-3}$ when converted into the hole density at room temperature, further desorption hardly occurs.

It is assumed that the process of imparting the p-type characteristic by heating is carried out according to such a mechanism. Therefore, in the conventional heat treatment, a large quantity of hydrogen remains in the semiconductor layer, so that the carrier density at room temperature is not sufficient. The contact resistance between the electrode and the semiconductor thus cannot be decreased lower than a certain level.

(IV) Heat Treatment Accompanying the Radiation of Electromagnetic Wave (Light)

On the other hand, the main feature of the heat treatment according to the present invention lies in radiating the electromagnetic wave to render the photons to be absorbed by the uppermost layer of the semiconductor layer.

When the photon having a larger energy than the band gap is absorbed in the semiconductor layer, there is formed pairs of electron and hole in the conduction band and the valence band at a density exceeding the thermal equilibrium. These pairs annihilate radiatively or non-radiatively to restore the thermal equilibrium. As a result, there exists in the conduction band, electrons in quantity exceeding that of the thermal equilibrium state. The density of the electrons depends on the strength of the radiated light.

In the p-type semiconductor layer forming process of the method for manufacturing the semiconductor device in accordance with the present invention, the excess electrons enhance the neutralizing reaction of $H^+$ so that the rapid decrease of the treatment rate caused by the p-type formation of the semiconductor layer doped with Mg is prevented. Thus, the desorption reaction of hydrogen is enhanced, thereby to form a p-type semiconductor layer having a higher hole density than that formed by the conventional heat treatment.

However, the effect of the heat treatment incorporating the electromagnetic wave radiation is not constant with respect to the direction of the thickness of the semiconductor layer. As can be understood from FIG. 11 wherein the diffusion rate of $H^+$ is assumed to be infinite, that is, there is no density distribution of $H^+$, in the heat treatment without electromagnetic wave radiation, the desorption rate of hydrogen is large only during the early stage after the start of the treatment and thereafter, the desorption from the surface of the layer is largely decreased. Therefore, although the diffusion rate of $H^+$ in the semiconductor layer may be small, the rate of desorption of hydrogen as a whole is determined on the rate of desorption from the semiconductor layer surface.

On the other hand, under the radiation of the electromagnetic wave, due to the operation of the excited electrons in the conduction band, the density of neutralized $H^0$ at the surface becomes much larger than the ordinary thermal equilibrium state. Thus, the desorption of hydrogen at the surface is maintained much longer than in the conventional heat treatment. As a result, the effect of the fact that the diffusion rate of $H^+$ in the semiconductor layer is limited becomes apparent, thereby rendering the distribution of hydrogen density adjacent the surface to be largely decreased.

Thus when the heat treatment accompanying the radiation of electromagnetic wave having a larger energy than the forbidden band is carried out, although the inner portion of the semiconductor layer has the same hole density as that resulting from the conventional heat treatment, the surface has a much larger hole density. Hence the contact resistance between the semiconductor layer and the electrode is decreased.

The characteristics of the semiconductor device manufactured in accordance with the present invention is described hereinafter.

An example of the semiconductor device which will be described hereinafter was manufactured in accordance with the process (II) described above. A mercury xenon lamp wherein light in a visible spectrum range and infrared range is removed was used as the light source. More particularly, the electromagnetic wave emitted from the mercury xenon lamp was an ultraviolet light having the wavelength about 365 nm or less. The treatment temperature was 800° C., the treatment time, 20 minutes, and the ambient atmosphere was nitrogen. The strength of the radiation at the susceptor surface was considered to be 100 mW/cm$^2$ and the radiation was started after the temperature reached 800° C.

In the p-type semiconductor layer forming process, after the lapse of 20 minutes, the radiation was stopped, and the temperature was lowered, thereby forming a specimen 1. In a case where the radiation from the light source 13 was continued during, the decrease of the temperature, a specimen 2 was obtained. Samples 1 and 2 of semiconductor devices were cut out from the specimens 1 and 2, respectively. The characteristics of the samples were then evaluated.

Figure 3:
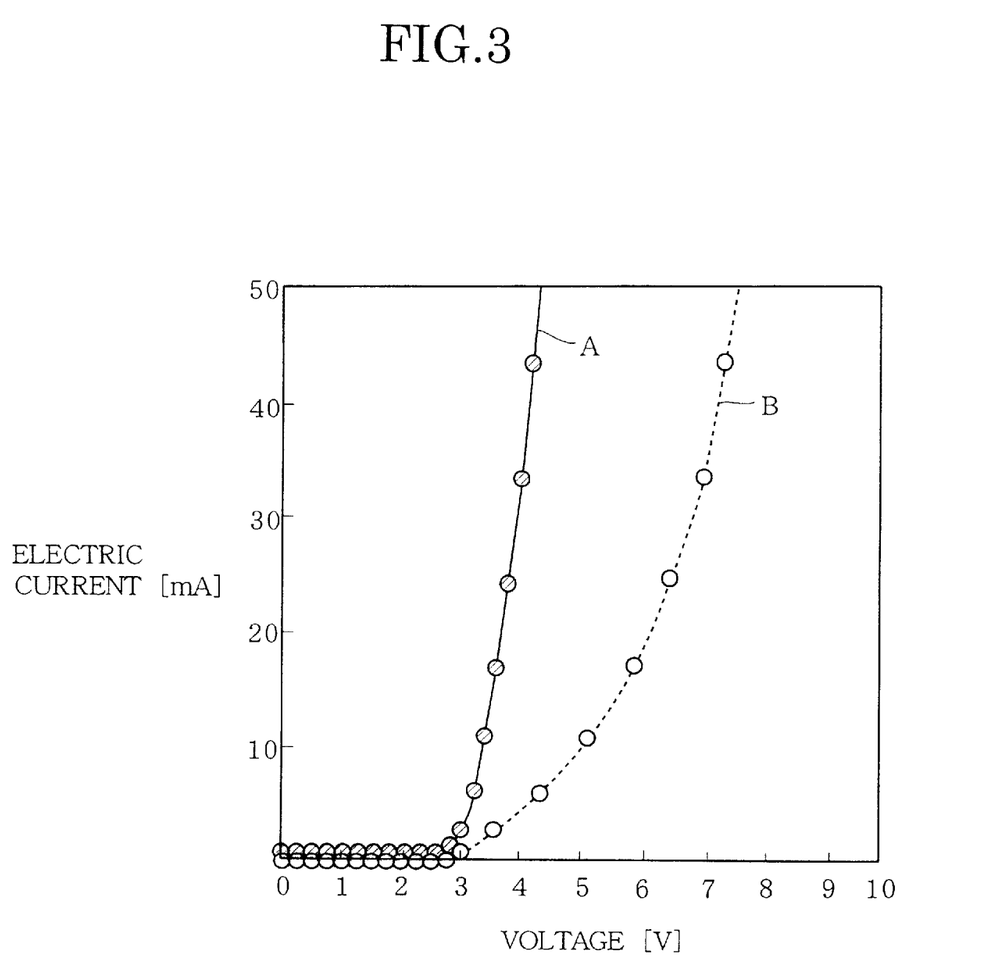
FIG. 3 is a graph showing the relationship between electric current and voltage in an example of a semiconductor device manufactured in accordance with the present invention and a conventional semiconductor device.

FIG. 3 shows voltage-to-current characteristic. The ordinate and abscissa in FIG. 3 indicate electric current (mA) and voltage (V), respectively, and a solid line A shows the characteristic of the sample 1, and a dotted line B shows the characteristic of a semiconductor device manufactured in accordance with the conventional heat treatment without radiating the electromagnetic wave on the surface of the GaN semiconductor layer doped with Mg.

As shown in the figure, there can be seen a significant curve where the increase of the current is started in the conventional device, implying the existence of some kind of potential barrier at the electrode connected to the p-type semiconductor layer. On the other hand, in the case of the sample 1 manufactured by the heat treatment accompanying the radiation of electromagnetic wave, the increasing characteristic of the current is significantly improved, indicating that the contacting state of the electrode is largely improved.

Figure 4:
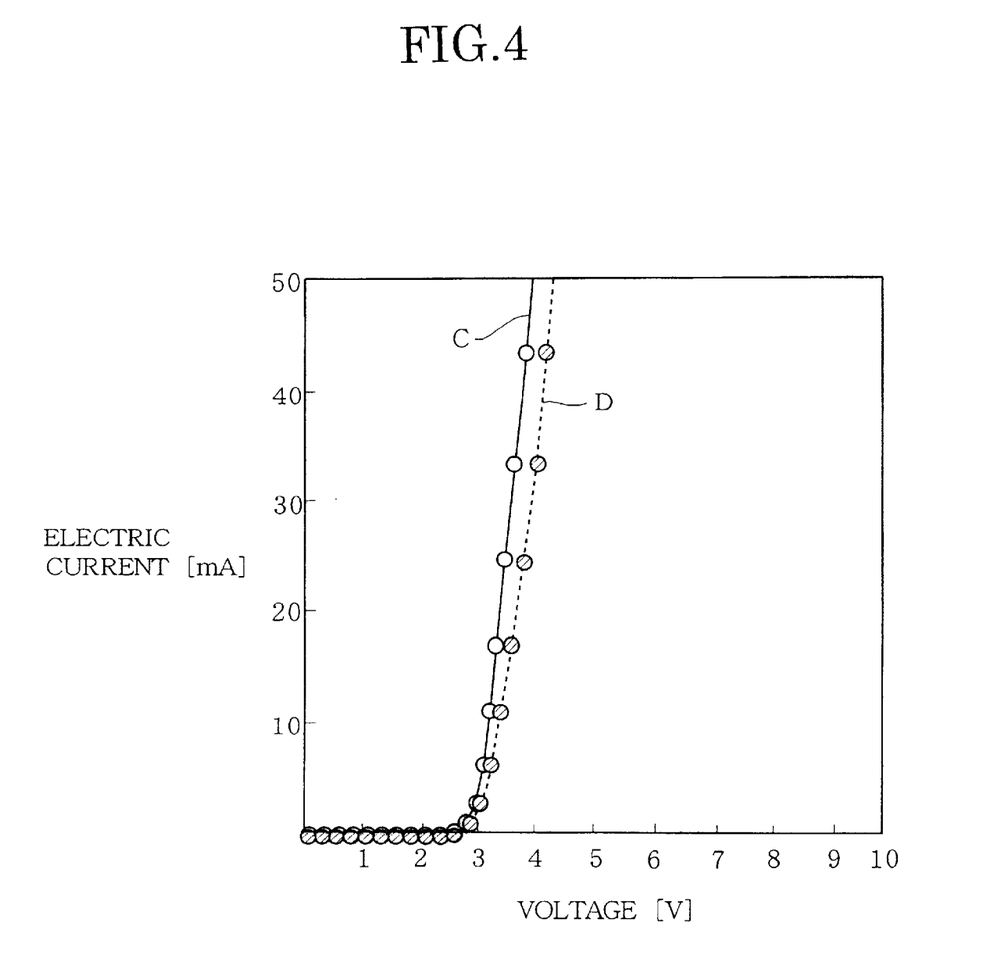
FIG. 4 is a graph showing the relationship between electric current and voltage in examples of a semiconductor device manufactured in accordance with the present invention.

Referring to FIG. 4, a solid line C shows the characteristic of the sample 2, and a dotted line D shows the characteristic of the sample 1.

As can be seen from FIG. 4, both samples 1 and 2 have a similar characteristic in a small current range at the start of the, increase of the current. However, in a linear range where the current is increased, the inclination of the line C is larger than that of the line D. Namely, the resistance can be further decreased if the radiation of the electromagnetic wave is continued while the semiconductor layer is cooled.

A phenomenon which occurs when the radiation of the electromagnetic wave is continued during the cooling is explained. $H^+$ dissociated in the semiconductor layer by heat treatment reaches an equilibrium in a neutralized state caused by the reaction expressed by the formula (4). As described above, since the neutral $H^0$ is unstable, under the radiation of the electromagnetic wave radiation, in a range of the semiconductor layer where the electromagnetic wave reaches, the density of the neutral $H^0$ is larger than the normal thermal equilibrium state due to the excited electrons in the conduction band.

When the radiation is stopped and the temperature is decreased as in the case of the specimen 1, the neutral $H^0$ is quickly dissociated into $H^+$ and $e^-$. $H^+$ is again bonded with $Mg^-$ while $e^-$ is bonded with a hole and then vanishes.

On the contrary, when the radiation is continued as the temperature decreases, although $H^0$ is unstable, the semiconductor layer is cooled while the electrons are deflected from the equilibrium due to the radiation. Hence, neutral $H^0$ is retained in a semi-stable state. The conductive electrons e⁻ return to the thermal equilibrium state when cooled.

It is to be understood that a part of hydrogen which has existed as the Mg—H complex does not desorb from the semiconductor layer, but the part remains in the semiconductor layer in the form of $H^0$ different from the Mg—H complex as $H^0$. Since the $H^0$ is not bonded with Mg, the hole density increases. Such a reaction does not accompany the desorption of hydrogen from the semiconductor layer so that the depth in which the hole density is increased becomes larger than in the sample 1. Accordingly, the p-type semiconductor layer of the sample 2 has less resistance than that of the sample 1.

Although a pn homo-junction diode has been described as an embodiment of the present invention, the present invention may be applied to devices having other junction structures such as double heterostructure, separate confinement heterostructure (SCH), and quantum well laser structure, and moreover to unipolar devices such as a p-channel field effect transistor (FET).

From the foregoing it will be understood that the present invention provides a method for manufacturing a semiconductor device having a p-type GaN semiconductor layer of high hole density, thereby enabling to decrease the contact resistance between the electrode and the semiconductor layer. In addition, since the heat treatment for forming a low resistance p-type semiconductor includes radiating the electromagnetic wave such as the ultraviolet light, the entire wafer can be treated at one time. Hence mass production can be realized without requiring an electron beam device for scanning electron beams, and high vacuum.

While the invention has been described in conjunction with preferred specific embodiment thereof, it will be understood that this description is intended to illustrate and not limit the scope of the invention, which is defined by the following claims.

What is claimed is:

1. A method for manufacturing a semiconductor device, the steps comprising:

forming a GaN type semiconductor layer in which a group 2 impurity element is added;

heating the GaN type semiconductor layer at a predetermined temperature, and irradiating the semiconductor layer with an electromagnetic wave having an energy larger than the band gap energy of the GaN type semiconductor layer; and forming an electrode on the semiconductor layer.

2. The method according to claim 1 wherein the electromagnetic wave is applied to a surface of the GaN type semiconductor layer.

3. The method according to claim 1 wherein the electromagnetic wave is applied for a predetermined time when the GaN type semiconductor layer is at the predetermined temperature.

4. The method according no claim 1 wherein the GaN type semiconductor layer is a group 3 nitride expressed by a following formula $$(Al_xGa_{1-x})_{1-y}In_yN(0 \leq x \leq 1.0, 0 \leq y \leq 1.0)$$

5. The method according to claim 1 wherein the wavelength of the electromagnetic wave corresponds to the composition of an uppermost layer of the GaN type semiconductor layer.

6. The method according to claim 1 wherein the step for forming the GaN type semiconductor layer is performed by the metal organic chemical vapor deposition method.

7. The method according to claim 1 wherein the predetermined temperature is 300° C. or more and lower than 1000° C.

8. The method according to claim 1 wherein the electromagnetic wave is continuously applied to the GaN type semiconductor layer until the temperature of the semiconductor layer becomes lower than 300° C.

9. The method according to claim 5 wherein the electromagnetic wave has a wavelength whose energy becomes larger than the band gap energy of an uppermost layer.

* * * * *